United States Patent
Lee et al.

(10) Patent No.: US 9,086,464 B2
(45) Date of Patent: Jul. 21, 2015

(54) METHOD AND APPARATUS FOR CONTROLLING AN AMPLIFIER OF A MAGNETIC RESONANCE IMAGING DEVICE

(75) Inventors: Jung-woo Lee, Gyeonggi-do (KR); Seung-je Choi, Gyeonggi-do (KR); Hyug-rae Cho, Seoul (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 466 days.

(21) Appl. No.: 13/425,533

(22) Filed: Mar. 21, 2012

(65) Prior Publication Data
US 2013/0043871 A1    Feb. 21, 2013

(30) Foreign Application Priority Data
Aug. 19, 2011    (KR) .................. 10-2011-0083052

(51) Int. Cl.
G01V 3/00    (2006.01)
G01R 33/385    (2006.01)
G01R 33/36    (2006.01)

(52) U.S. Cl.
CPC ........ *G01R 33/3852* (2013.01); *G01R 33/3614* (2013.01)

(58) Field of Classification Search
CPC .................................................. G01R 33/3614
USPC .................. 324/322, 318, 314, 309, 307, 300
See application file for complete search history.

(56) References Cited

U.S. PATENT DOCUMENTS

| | | | |
|---|---|---|---|
| 4,755,769 A * | 7/1988 | Katz | 330/295 |
| 4,780,685 A * | 10/1988 | Ferguson | 330/124 D |
| 5,066,914 A * | 11/1991 | Vavrek et al. | 324/309 |
| 5,182,465 A | 1/1993 | Stanley | |
| 6,507,243 B2 * | 1/2003 | Harris et al. | 330/129 |

FOREIGN PATENT DOCUMENTS

| | | |
|---|---|---|
| CN | 101907692 A | 12/2010 |
| EP | 0454298 A2 | 10/1991 |
| JP | 2096679 A | 4/1990 |
| JP | 2009039247 A | 2/2009 |

OTHER PUBLICATIONS

Xiao-Hua Jiang et al., Gradient Amplifier for Magnetic Resonance Imaging System, Jun. 2005, 2 pages, vol. 39, No. 3, Beijing, China.

* cited by examiner

*Primary Examiner* — Louis Arana
(74) *Attorney, Agent, or Firm* — Cha & Reiter, LLC.

(57) ABSTRACT

An magnetic resonance imaging (MRI) device includes at least one amplifier, a control module which controls an operating module of the at least one amplifier, a back-up control module, a determination unit for determining whether the control module is operating normally, and a switching module for performing a switching operation to switch operations of the control module to the at least one back-up control module in the event of abnormal operation of the control module.

20 Claims, 4 Drawing Sheets

METHOD AND APPARATUS FOR CONTROLLING AN AMPLIFIER OF A MAGNETIC RESONANCE IMAGING DEVICE

CLAIM OF PRIORITY

This application claims priority under 35 U.S.C. §119(a) to Korean Patent Application No. 10-2011-0083052, filed on Aug. 19, 2011, in the Korean Intellectual Property Office, the disclosure of which is incorporated herein in its entirety by reference.

BACKGROUND OF THE INVENTION

1. Field of the Invention

The present invention relates to a magnetic resonance imaging device, an amplifier for the magnetic resonance imaging device, and a method of controlling the amplifier.

2. Description of the Related Art

Magnetic resonance imaging (MRI) devices obtain a tomographic image of human tissues by using a magnetic field generated by a magnetic force, and using resonance of an applied electromagnetic field to generate radio frequencies when the applied electromagnetic field is removed. MRI devices in the prior art typically include an amplifier for amplifying a waveform of the electromagnetic field to be applied to human tissues in order to cause the resonance in the human tissues. Such amplifiers in the prior art include elements and other components which may fail, which reduces the operating efficiency of the MRI devices.

SUMMARY OF THE INVENTION

The present invention provides a magnetic resonance imaging device, an amplifier for the magnetic resonance imaging device having an increased operating efficiency, and a method of controlling the same.

The present invention also provides a non-transitory computer readable recording medium having embodied thereon a computer program for executing the method of the present invention.

According to an aspect of the present invention, there is provided an amplifier for a magnetic resonance imaging (MRI) device including a first module and a second module, the amplifier including: at least one back-up first module that is a back-up module in the event of a failure in the first module leading to abnormal operation of the first module; a determination unit for determining whether the first module is operating normally; and a switching module, according to a result of the determination, if it is determined that the first module is not operating normally, for performing a switching operation by which an operation to be performed by the first module is performed by the back-up first module, wherein elements included in the first module are subject to more frequent failures than elements included in the second module.

The elements included in the first module may be determined in consideration of a history of failures occurred in the past in each of elements included in the amplifier.

According to another aspect of the present invention, there is provided a magnetic resonance imaging (MRI) device including at least one amplifier, the MRI device including: an operating module of the at least one amplifier; a control module for controlling the operating module; at least one back-up control module that is a back-up module in the event of a failure in the control module leading to abnormal operation of the control module; a determination unit for determining whether the control module is operating normally; and a switching module, according to a result of the determination, if it is determined that the control module is not operating normally, for performing a switching operation by which the operating module is controlled by the at least one back-up control module.

The control module and the at least one back-up control module may be each implemented in the form of an integrated circuit board including devices for performing various functions for controlling the operating module.

According to another aspect of the present invention, there is provided an amplifier for an MRI device, the amplifier including: an operating module for performing an operation for amplifying a waveform; a control module for controlling the operating module; at least one back-up control module that is a back-up module for the control module; and a switching module for performing a switching operation by which the operating module is controlled by the at least one back-up control module.

According to another aspect of the present invention, there is provided a method of controlling an amplifier for an MRI device, the method including: providing a control module for controlling an operating module of the amplifier; providing at least one back-up control module that is a back-up module in the event of a failure in the control module leading to abnormal operation of the control module; determining whether the control module is operating normally; according to a result of the determination, if it is determined that the control module is not normally operating, performing a switching operation by which the operating module is controlled by the at least one back-up control module; and according to a result of the switching operation, controlling the operating module by using the at least one back-up control module.

According to another aspect of the present invention, there is provided a method of controlling an amplifier for an MRI device including a first module and a second module, the method including: providing the first module and the second module so that elements included in the first module are subject to more frequent failures than elements included in the second module; providing a back-up first module which performs an operation provided by the first module; determining whether the first module is operating normally; and according to a result of the determination, if it is determined that the first module is not operating normally, performing a switching operation by which an operation to be performed by the first module is performed by a back-up first module.

BRIEF DESCRIPTION OF THE DRAWINGS

The above features and advantages of the present invention will become more apparent by describing in detail exemplary embodiments thereof with reference to the attached drawings in which.

DETAILED DESCRIPTION OF THE INVENTION

The following description, with reference to the accompanying drawings, is provided to assist a person of ordinary skill in the art with a comprehensive understanding of exemplary embodiments of the invention. The description includes various specific details to assist in that understanding but these details are to be regarded as merely exemplary. This invention may, however, be embodied in many different forms and should not be construed as limited to the exemplary embodiments set forth herein. Accordingly, those of ordinary skill in the art will recognize that various changes and modifications of the exemplary embodiments described herein can be made without departing from the spirit of the invention and the scope of the appended claims. Also, descriptions of well-known functions and constructions may be omitted for clarity and simplicity so as not to obscure appreciation of the present invention by a person of ordinary skill with details of such well-known functions and constructions.

The terms and words used in the following description and claims are not limited to the bibliographical meanings, but, are merely used by the inventor to enable a clear and consistent understanding of the invention. Also, terms described herein, which are defined considering the functions of the present invention, may be implemented differently depending on user and operator's intention and practice. Therefore, the terms should be understood on the basis of the disclosure throughout the specification. The principles and features of this invention may be employed in varied and numerous embodiments without departing from the scope of the invention. Expressions such as "at least one of," when preceding a list of elements, modify the entire list of elements and do not modify the individual elements of the list. Furthermore, it is to be understood that the singular forms "a", "an", and "the" include plural references unless the context clearly dictates otherwise. Thus, for example, reference to "a component surface" typically includes reference to one or more of such surfaces.

Furthermore, although the drawings represent exemplary embodiments of the invention, the drawings are not necessarily to scale and certain features may be exaggerated or omitted in order to more clearly illustrate and explain the present invention. Throughout the drawings, like reference numerals will be understood to refer to like parts, components and structures.

The present invention will now be described more fully with reference to the accompanying drawings, in which exemplary embodiments of the present invention are shown.

Figure 1:
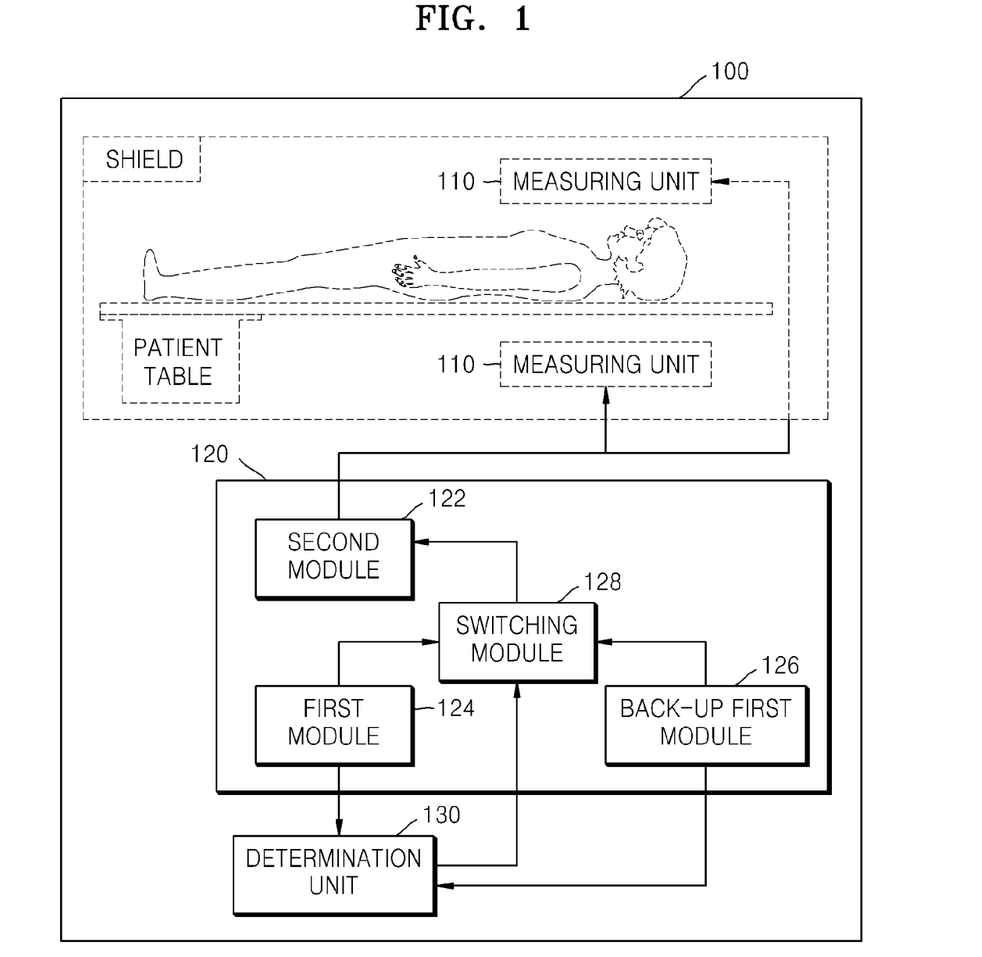
FIG. 1 is a view illustrating a magnetic resonance imaging (MRI) device according to an embodiment of the present invention.

FIG. 1 is a view illustrating a magnetic resonance imaging (MRI) device 100 according to an embodiment of the present invention.

Referring to FIG. 1, the MRI device 100 includes at least one measuring unit 110, an amplifier 120, and a determination unit 130. The amplifier 120 includes a second module 122, a first module 124, a back-up first module 126, and a switching module 128. The modules according to the illustrated embodiment are units that may be independently operable and each may include hardware, software, or a combination of both a software module and a hardware module.

For convenience of description, FIG. 1 illustrates one amplifier 120 and one back-up first module 126. However, the present invention is not limited thereto, and the MRI device 100 may include a plurality of the amplifiers 120 and a plurality of the back-up first modules 126, as described herein with reference to FIG. 2.

The MRI device 100 illustrated in FIG. 1 is shown to specifically include components related to the illustrated embodiment, but it is to be understood that, the MRI device 100 may also include other general-purpose and well known components for enabling proper operation of MRI device 100 to perform magnetic resonance imaging of subjects such as patients.

That is, in the illustrated embodiment, MRI device 100 is an apparatus for non-invasively obtaining an image including information regarding body tissues of a subject. For example, the MRI device 100 may be an apparatus for obtaining a diagnostic image of a subject by using a magnetic field generated by a magnetic force, but the present invention is not limited thereto.

The measuring unit 110 measures a magnetic property of a subject in order to obtain a diagnostic image of the subject. For example, the measuring unit 110 may include at least one coil and at least one magnet.

Also, in order to measure a magnetic property of a subject, the subject and the measuring unit 110 may be located in a space shielded from outside electromagnetic interference, but the present invention is not limited thereto.

The amplifier 120 amplifies a waveform, such as a radio frequency (RF) signal, and outputs the amplified waveform to the measuring unit 110. For example, the amplifier 120 amplifies a waveform to be output to the coil included in the measuring unit 110.

The amplifier 120 includes the first module 124 and the second module 122. In accordance with one embodiment of the invention, elements that are included in the first module 124 are selected for inclusion therein due to the fact that they are subject to more frequent failures than elements included in the second module 122.

The term "element", as used herein, includes any component, subcomponent, device, or part included in the amplifier 120.

For example, in accordance with one embodiment of the invention, a plurality of elements included in the amplifier 120 may be disposed in either of the first module 124 and the second module 122 according to a frequency of failures. In this regard, the elements included in the first module 124 may be determined with reference to a history of failures occurred in the past in each of the elements included in the amplifier 120.

That is, from among the elements included in the amplifier 120, elements having a relatively high frequency of failures may be disposed in the first module 124, and elements having a relatively low frequency of failures may be disposed in the second module 122. The frequency of failures may be determined by referring to the history of failures occurred in each element in the past.

More specifically, from among the elements included in the amplifier 120, the elements having a relatively high frequency of failures may include a power stage topology unit, a power management unit, an electrical isolation unit, a load and amplifier protection unit, a current limit potentiometer, an external synchronization fault protection device, a noise filter, a command processing unit, a current loop and modulation control unit, a clock synchronization device, an analog and digital input/output (I/O) device, and controls and status indicators, but the present invention is not limited thereto.

Thus, the first module 124 according to the illustrated embodiment may include at least one from among the above-described elements having a relatively high frequency of failures.

Also, each of the first module 124 and the second module 122 according to the illustrated embodiment may be implemented in the form of an integrated circuit board. That is, the amplifier 120 of the illustrated embodiment may include an integrated circuit board corresponding to the first module 124 and another integrated circuit board corresponding to the second module 122.

The at least one back-up first module 126 is used as a back-up module to be a back-up or redundant device with respect to the first module 124. For example, when the first module 124 is implemented in the form of an integrated circuit board, the back-up first module 126 may also be implemented in the form of an integrated circuit board. More specifically, the back-up first module 126 is a module implemented to perform the same functions as performed by the first module 124.

According to a result of a determination by the determination unit 130 that the first module 124 is not operating normally, the switching module 128 performs a switching operation by which an operation to be performed by the first module 124 is performed by the back-up first module 126. In this regard, any operations to be performed by the first module 124 may vary according to the type of the elements included in the first module 124.

Accordingly, if the first module 124 is not operating normally (that is, it has performed an abnormal operation or is not operating within predetermined performance requirements), the amplifier 120 may operate by using the back-up first module 126. The modules according to the illustrated embodiment may be implemented to independently operate. Thus, when the first module 124 is not operating normally, the first module 124 may be replaced even while the back-up first module 126 is operating. In this case, the first module 124 may be replaced with a new module performing the same operations as the first module 124; that is, as the back-up first module 126 is operating in place of the first module 124, the first module 124 may be swapped out, and a replacement first module may be installed to resume the operations of the first module 124 in the amplifier 120.

For example, the MRI device 100 is implemented in such a way that the first module 124 is replaced while performing an operation according to the MRI device 100 by using the back-up first module 126. That is, in the MRI device 100 according to the illustrated embodiment, the first module 124 may be replaced, simultaneously, while performing an operation according to the first module 124 by using the back-up first module 126.

Also, the switching module 128 according to the illustrated embodiment may automatically operate to perform the switching operation without user manipulation. For example, according to a result of the determination by the determination unit 130, if it is determined that the first module 124 is not operating normally, the switching module 128 automatically performs the switching operation.

In this case, the MRI device 100 may provide information to a user, such as an MRI technician, indicating that the first module 124 is not operating normally. For example, the MRI device 100 may provide information indicating that the first module 124 is not operating normally by using a message indicating that the first module 124 is not operating normally, an alert alarm, or flickering of an alert light, or an audible alert buzzer through a user interface unit (not shown).

The determination unit 130 determines whether the first module 124 is operating normally or not. The determination unit 130 of the illustrated embodiment determines whether the first module 124 is operating normally by using, for example, an error detecting method known in the art.

Additionally, the determination unit 130 according to the illustrated embodiment may also determine whether the back-up first module 126 is operating normally or not. According to a result of the determination by the determination unit 130, if it is determined that the back-up first module 126 is not operating normally, the switching module 128 may perform a switching operation by which an operation to be performed by the back-up first module 126 is performed by the first module 124 or another back-up first module 126.

Thus, if the first module 124 is not operating normally according to a result of the determination by the determination unit 130, the amplifier 120 may operate by using the back-up first module 126, and thus the MRI device 100 may operate without interruption to be continuously used.

Figure 2:
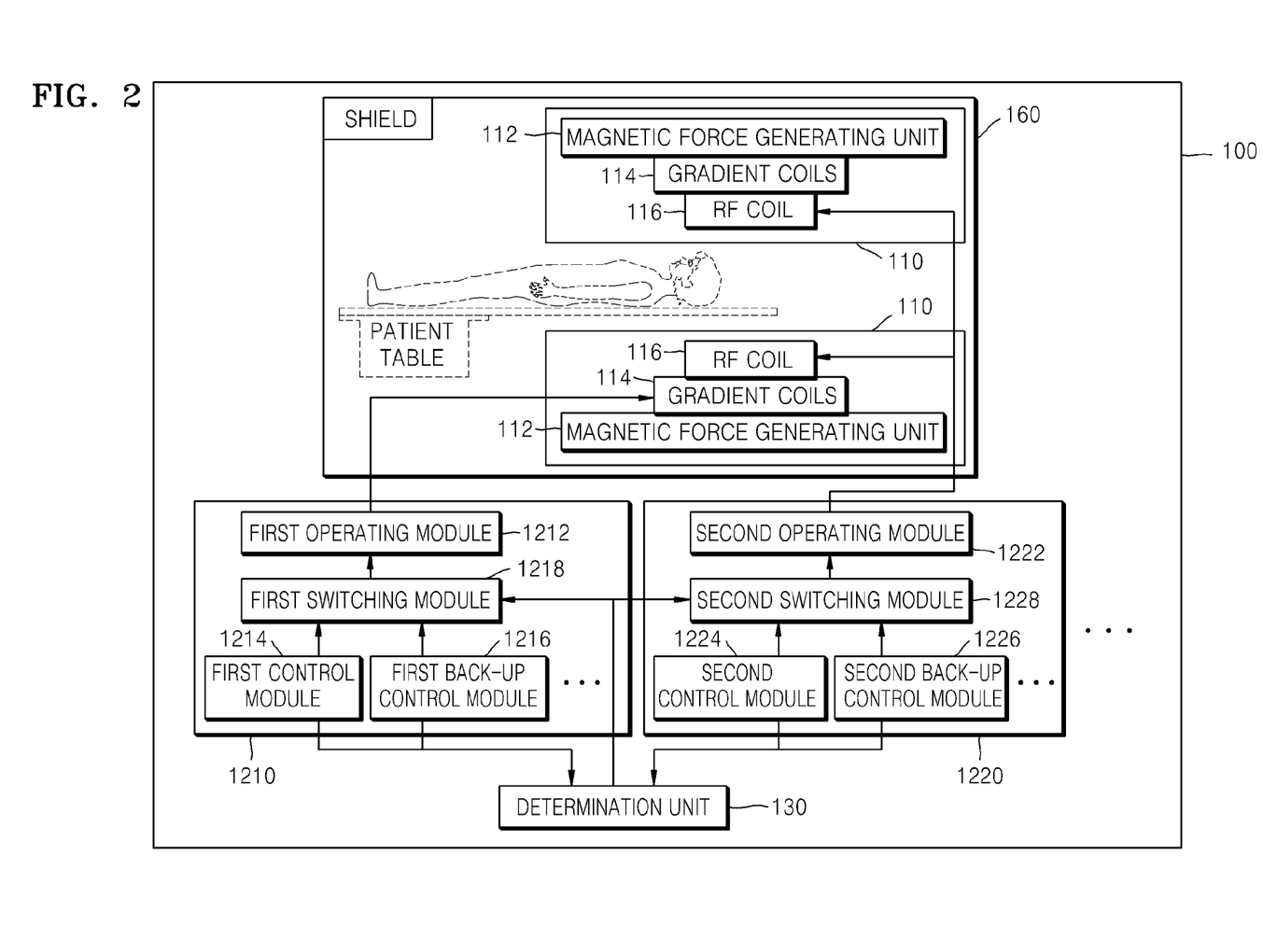
FIG. 2 is a view illustrating an MRI device according to another embodiment of the present invention.

FIG. 2 is a view illustrating an MRI device 100 according to another embodiment of the present invention. Referring to FIG. 2, the MRI device 100 includes at least one measuring unit 110, a first amplifier 1210, a second amplifier 1220, and a determination unit 130. Also, the measuring unit 110 includes a magnetic force generating unit 112, a plurality of gradient coils 114, and a radio frequency (RF) coil 116. The first amplifier 1210 includes a first operating module 1212, a first control module 1214, a first back-up control module 1216, and a first switching module 1218. The second amplifier 1220 includes a second operating module 1222, a second control module 1224, a second back-up control module 1226, and a second switching module 1228.

The MRI device 100 illustrated in FIG. 2 includes components related to the illustrated embodiment and may also include other general-purpose components.

Additionally, the MRI device 100 illustrated in FIG. 2 is just one example of the MRI device 100 illustrated in FIG. 1, and thus the MRI device 100 according to the illustrated embodiment is not limited to the elements illustrated in FIG. 2. In addition, the description with regard to FIG. 1 may also be used in describing the MRI device 100 illustrated in FIG. 2, and thus a repeated description thereof will be omitted.

The MRI device 100 is an apparatus for obtaining a diagnostic image of a subject by using a magnetic field generated by a magnetic force.

Accordingly, the measuring unit 110 measures a magnetic property of a subject in order to obtain a diagnostic image of the subject. For example, the measuring unit 110 generates a magnetic field by using the magnetic force generating unit 112, generates a high-frequency signal by using the RF coil 116, and generates a gradient field by using the gradient coils 114.

For convenience of description, FIG. 2 illustrates the measuring unit 110 and a subject that may be located in a shielded space 160, but the present invention is not limited thereto, and the MRI device 100 may be implemented as an open-type MRI device.

The magnetic force generating unit 112 generates a magnetic force for forming a static magnetic field in the shielded space 160. For example, the magnetic force generating unit 112 according to the illustrated embodiment may include an electromagnet, a superconducting electromagnet, or a permanent magnet in which a magnitude of a magnetic field is in a range of about 0.2 T to about 0.3 T, but the present invention is not limited thereto.

The gradient coils 114 generate a spatial change in a magnetic field generated by a magnetic force generated by the magnetic force generating unit 112. For example, the gradient coils 114 may include an x-axis coil, a y-axis coil, and a z-axis coil for generating a spatial change in the magnetic field in x, y, and z directions, but the present invention is not limited thereto.

The RF coil 116 generates a high-frequency signal for exciting spins of nuclei of atoms at a region of interest inside the body of a subject in which a diagnostic image of the subject is to be obtained. Thus, the RF coil 116 forms an RF field which is intermittently applied for exciting spins in nuclei in the subject and, between applications of the RF field, the RF coil 116 receives a magnetic resonance signal from the precessing decay of the spins.

The first amplifier 1210 and the second amplifier 1220 amplify a waveform, such as an RF signal, and output the amplified waveform to the measuring unit 110. In this regard, the first amplifier 1210 and the second amplifier 1220 may be examples of the amplifier 120 illustrated in FIG. 1.

Hereinafter, for convenience of description, an example embodiment in which the first amplifier 1210 is a gradient amplifier for amplifying signals applied to the gradient coils 114, and the second amplifier 1220 is an RF amplifier for amplifying signals applied to the RF coil 116 will be described, but the present invention is not limited thereto.

Also, FIG. 2 is similar to FIG. 1 in that, the first module 124 of FIG. 1 is a control module of the first amplifier 1210 or the second amplifier 1220 and the second module 122 of FIG. 1 is an operating module of the first amplifier 1210 or the second amplifier 1220, but the present invention is not limited thereto. That is, when considering the operating module and the control module of the first amplifier 1210 or the second amplifier 1220, it may be the control module which experiences more frequent failures than the operating module, and thus the control module of one of the amplifiers 1210, 1220 is to be designated the first module 124, while the operating module is to be designated the second module 122, as in FIG. 1. Accordingly, the first module 124 and the second module 122 of FIG. 1 may be respectively implemented as the control module and the operating module of the first amplifier 1210 or the second amplifier 1220.

Also, the control module according to the illustrated embodiment may include at least one element selected from the group consisting of a gain potentiometer, an offset potentiometer, a current limit potentiometer, a head for a load tuning unit, an external synchronization fault protection device, a noise filter, a command processing unit, a current loop and modulation control unit, a clock synchronization device, an analog and digital I/O device, controls and status indicators, and an RS-232 adjustable tuning device, but the present invention is not limited thereto. Thus, the control module according to the illustrated embodiment controls the operating module to perform an operation for amplifying a waveform. Also, the control module according to the illustrated embodiment may be implemented in the form of an integrated circuit board including devices for performing the function of controlling the operating module.

The first amplifier 1210 amplifies a signal applied to the gradient coils 114. For example, the signal amplified by the first amplifier 1210 may have a current in a range of about 200 Amperes (A) to about 300 A or a voltage in a range of about 200 V to about 300 V, but the present invention is not limited thereto.

A first operating module 1212 performs an operation of amplifying a gradient waveform, and a first control module 1214 controls the first operating module 1212. The first back-up control module 1216 is a back-up module for the first control module 1214 and may be implemented to perform the same functions as the first control module 1214.

According to a result of determination of abnormal operation of the first control module 1214 by the determination unit 130, if it is determined that the first control module 1214 is not operating normally, the first switching module 1218 performs a switching operation by which the first operating module 1212 is controlled by the first back-up control module 1216.

Also, the second amplifier 1220 amplifies a signal applied to the RF coil 116. For example, the signal amplified by the second amplifier 1220 may have an output of several to several tens of kilowatts (kW), but the present invention is not limited thereto.

The second operating module 1222 performs an operation of amplifying an RF waveform, and the second control module 1224 controls the second operating module 1222. The second back-up control module 1226 is a back-up module for the second control module 1224 and may be implemented to perform the same functions as the second control module 1224.

According to a result of determination of abnormal operation of the second control module 1224 by the determination unit 130, if it is determined that the second control module 1224 is not operating normally, the second switching module 1228 performs a switching operation by which the second operating module 1222 is controlled by the second back-up control module 1226.

In this regard, when each of the first control module 1214 and the second control module 1224 is implemented in the form of an integrated circuit board, each of the first back-up control module 1216 and the second back-up control module 1226 may also be implemented in the form of an integrated circuit board similar to the first control module 1214 and the second control module 1224.

According to a result of determination of abnormal operation of the first control module 1214 by the determination unit 130, if it is determined that the first control module 1214 is not operating normally, the first switching module 1218 performs a switching operation by which the first operating module 1212 is controlled by the first back-up control module 1216. Also, according to a result of determination abnormal operation of the second control module by the determination unit 130, if it is determined that the second control module 1224 is not operating normally, the second switching module 1228 performs a switching operation by which the second operating module 1222 is controlled by the second back-up control module 1226. Thus, if the first control module 1214 or the second control module 1224 is not operating normally, the first operating module 1212 or the second operating module 1222 may be controlled by the first back-up control module 1216 or the second back-up control module 1226, respectively.

The modules according to the illustrated embodiment may be implemented to operate independently. Accordingly, when the first control module 1214 is not operating normally, the first control module 1214 may be replaced with a new or otherwise properly operating replacement first control module, even while the first back-up control module 1216 is operating. Also, when the second control module 1224 is not operating normally, the second control module 1224 may be replaced with a new or otherwise properly operating replacement second control module, even while the second back-up control module 1226 is operating.

For example, the MRI device 100 is implemented in such a way that the first control module 1214 is replaced while controlling the first operating module 1212 by using the first back-up control module 1216 and also that the second control module 1224 is replaced while controlling the second operating module 1222 by using the second back-up control module 1226. That is, in the MRI device 100 according to the illustrated embodiment, the first control module 1214 may be implemented to be replaced, simultaneously, while controlling the first operating module 1212 by using the first back-up control module 1216, and the second control module 1224 may be implemented to be replaced, simultaneously, while controlling the second operating module 1222 by using the second back-up control module 1226.

In this example embodiment, the first control module 1214 is replaced with a new control module performing the same operations of the first control module 1214, and the second control module 1224 is replaced with a new control module performing the same operations of the second control module 1224.

The determination unit 130 determines whether the first control module 1214 and the second control module 1224 are operating normally.

Accordingly, the MRI device 100 may control the first operating module 1212 for a gradient amplifier by using any one of the first control module 1214 and the first back-up control module 1216 and may control the second operating module 1222 for an RF amplifier by using any one of the second control module 1214 and the second back-up control module 1216.

Thus, in the MRI device 100, if either of the first control module 1214 and the second control module 1224 are not operating normally, the determination unit 130 according to the illustrated embodiment may allow the MRI device 100 to operate normally by instructing a switching operation to be performed by the first switching module 1218 or the second switching module 1228, or both, either one at a time or simultaneously.

Figure 3:
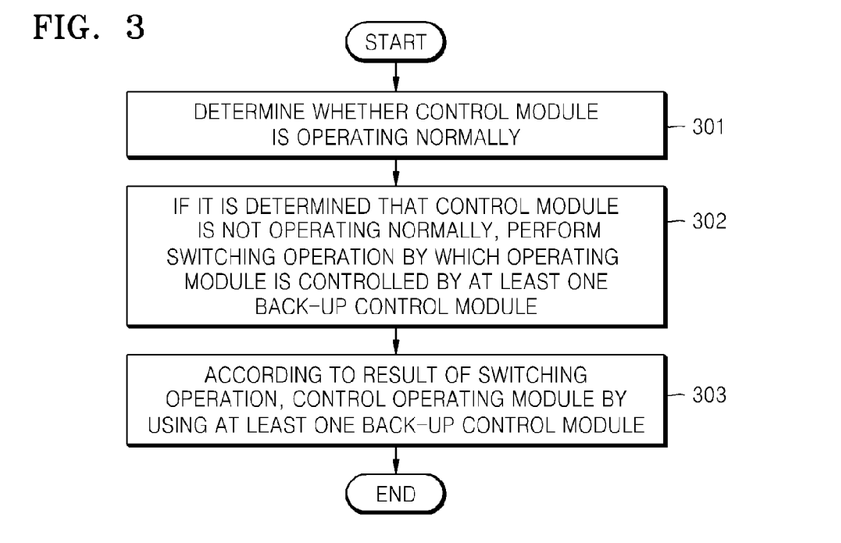
FIG. 3 is a flowchart illustrating a method of controlling an amplifier for an MRI device, according to an embodiment of the present invention.
Figure 4:
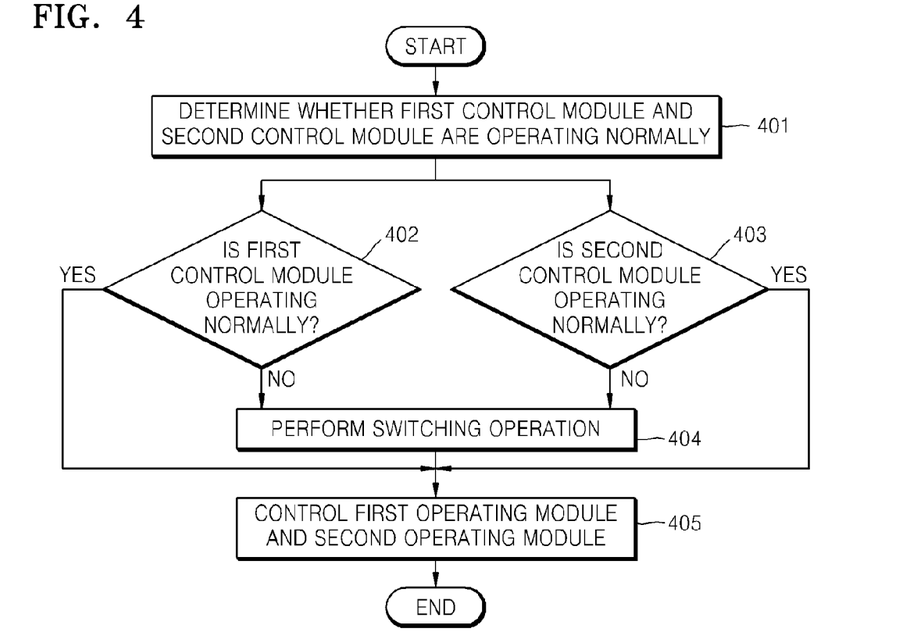
FIG. 4 is a flowchart illustrating a method of controlling an amplifier for an MRI device, according to another embodiment of the present invention.
Figure 5:
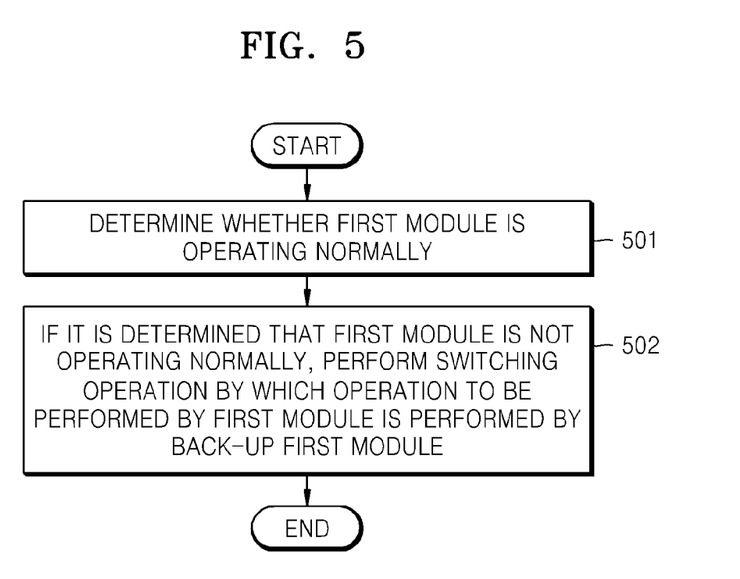
FIG. 5 is a flowchart illustrating a method of controlling an amplifier for an MRI device, according to an additional embodiment of the present invention.

FIGS. 3 to 5 are flowcharts illustrating a method of controlling the amplifier 120 for the MRI device 100, according to embodiments of the present invention. Referring to FIGS. 3 to 5, the methods for controlling the amplifier 120 for the MRI device 100 include steps and operations sequentially performed in the MRI device 100 illustrated in FIG. 1 or 2. Accordingly, the description with regard to the MRI device 100 illustrated in FIG. 1 or 2 may also be used in describing the methods for controlling the amplifier 120 for the MRI device 100 according to the illustrated embodiments.

FIG. 3 is a flowchart illustrating a method of controlling the amplifier 120 for the MRI device 100, according to an embodiment of the present invention. Hereinafter, the method of FIG. 3 will be described with reference to the apparatus of FIGS. 1 and 2.

Also, for convenience of description, an example embodiment in which the first module 124 is a control module and the second module 122 is an operating module will be described below, but the present invention is not limited thereto.

In step 301 of FIG. 3, the determination unit 130 determines whether the control module for controlling the operating module of the amplifier 120 is operating normally.

In step 302, as a result of the determination performed in step 301, if it is determined that the control module is not operating normally, the switching module 128 performs a switching operation by which the operating module is controlled by at least one back-up control module (additional back-up control modules are not specifically shown in FIG. 2, but any additional modules are represented by the series of dots shown in FIG. 2 to the right side of back-up control modules 1216 and 1226).

In step 303, as a result of the switching operation of step 302, the amplifier 120 controls the operating module by using the at least one back-up control module.

Thus, according to the method of controlling the amplifier 120 for the MRI device 100, if the control module is not operating normally, the amplifier 120 will continue to operate normally by switching to the back-up control module.

FIG. 4 is a flowchart illustrating a method of controlling the amplifier 120 for the MRI device 100, according to another embodiment of the present invention. Hereinafter, the method will be described with reference to FIGS. 2 and 4.

In step 401, the determination unit 130 determines whether the first control module 1214 of the first amplifier 1210 and the second control module 1224 of the second amplifier 1220 are operating normally.

In step 402, as a result of the determination performed in step 401, if the first control module 1214 of the first amplifier 1210 is operating normally, the method proceeds to step 405, and if not, the method proceeds to step 404. In step 403, as a result of the determination performed in step 401, if the second control module 1224 of the second amplifier 1220 is operating normally, the method proceeds to step 405, and if not, the method proceeds to step 404.

In step 404, at least one of the first switching module 1218 and the second switching module 1228 performs a switching operation. For example, if the first control module 1214 of the first amplifier 1210 is not operating normally, the first switching module 1218 performs a switching operation, and if the second control module 1224 of the second amplifier 1220 is not operating normally, the second switching module 1228 performs a switching operation, to switch to using the respective back-up modules associated with the control modules 1214, 1224.

In step 405, the first operating module 1212 of the first amplifier 1210 is controlled by using either of the first control module 1214 and the first back-up control module 1216, and the second operating module 1222 of the second amplifier 1220 is controlled by using either of the second control module 1224 and the second back-up control module 1226.

In this regard, if the first control module 1214 is operating normally, the first operating module 1212 is controlled by the first control module 1214, and if not, the first operating module 1212 is controlled by the first back-up control module 1216.

Also, if the second control module 1224 is operating normally, the second operating module 1222 is controlled by the second control module 1224, and if not, the second operating module 1222 is controlled by the second back-up control module 1226.

Thus, according to the method of controlling the amplifier 120 for the MRI device 100, if any one of the first control module 1212 and the second control module 1222 is not operating normally, the MRI device 100 may continue to operate normally and without interruption by using the respective back-up control modules associated with the control modules 1212, 1222.

FIG. 5 is a flowchart illustrating a method of controlling the amplifier 120 for the MRI device 100, according to another embodiment of the present invention. Hereinafter, the method will be described with reference to FIGS. 1 and 5.

In step 501, the determination unit 130 determines whether the first module 124 of the amplifier 120 is operating normally. In this regard, the amplifier 120 includes the first module 124 and the second module 122, and the elements included in the first module 124 are subject to more frequent failures than the elements included in the second module 122.

In step 502, as a result of the determination performed in step 501, if it is determined that the first module 124 is not operating normally, the switching module 128 performs a switching operation by which an operation to be performed by the first module 124 is performed by the back-up first module 126.

According to the above, in the MRI device 100 of the illustrated embodiment, if the first module 124 having elements which experience frequent failures is not operating normally, the MRI device 100 may operate normally and without interruption by using the back-up first module 126.

For example, in the MRI device 100 according to the illustrated embodiments, even if the control modules 124, 1214, and 1224 having elements which experience the most frequent failures are not operating normally, the MRI device 100 may operate normally and without interruption by using the back-up control modules 126, 1216, and 1226, respectively.

The MRI device 100 according to the illustrated embodiment includes the first back-up control module 1216 and the second back-up control module 1226 corresponding to the first and second control modules 1214 and 1224 in the first amplifier 1210 and the second amplifier 1220, respectively, and thus if only one of the first control module or the second control module 1224 is not operating normally, the entire first amplifier 1210 or the entire second amplifier 1220 does not need to be wholly replaced, since only a single module of the respective amplifier needs to be replaced while the amplifier continues to function with the respective back-up module, thereby reducing costs.

Also, when the MRI device 100 includes a plurality of the same amplifiers 120, unnecessary gaps in operating times of the MRI device 100 and unnecessary waste of resources, such as replacing entire amplifiers instead of just one faulty module, may be prevented. Accordingly, the MRI device 100 of the illustrated embodiment includes the back-up first module 126, the first back-up control module 1216, and the second back-up control module 1226 with respect to the first module 124, the first control module 1214, and the second control module 1224, respectively, and such first modules 124, 1214, and 1224 experience more frequent failures in the amplifier 120.

Thus, an increase in operating efficiency of the MRI device 100 may increase a patient turnover ratio. Also, customer dissatisfaction may be resolved by minimizing time spent restoring operation of the MRI device 100.

According to the present invention, when a control module of an amplifier included in an MRI device is not operating normally, an operating module which operates in conjunction with the control module can be controlled by using a back-up control module, and thus operating efficiency of the MRI device may be increased. Also, the operating efficiency of the MRI device may be increased by using a back-up module for a module including elements which experience more frequent failures from among elements of the amplifier included in the MRI device.

The embodiments of the present invention can be implemented in hardware, firmware or as software or computer code that can be stored in a recording medium such as a CD ROM, an RAM, a floppy disk, a hard disk, or a magneto-optical disk or computer code downloaded over a network originally stored on a remote recording medium or a non-transitory machine readable medium and to be stored on a local recording medium, so that the methods described herein can be rendered in such software that is stored on the recording medium using a general purpose computer, or a special processor or in programmable or dedicated hardware, such as an ASIC or FPGA. As would be understood in the art, the computer, the processor, microprocessor controller or the programmable hardware include memory components, e.g., RAM, ROM, Flash, etc. that may store or receive software or computer code that when accessed and executed by the computer, processor or hardware implement the processing methods described herein. In addition, it would be recognized that when a general purpose computer accesses code for implementing the processing shown herein, the execution of the code transforms the general purpose computer into a special purpose computer for executing the processing shown herein.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An amplifier for a magnetic resonance imaging (MRI) device, the MRI device including a determination unit, the amplifier comprising:
   a first module including at least a first element;
   a second module including at least a second element, wherein the at least the first element in the first module has a relatively higher frequency of failure rate than the at least the second element in the second module;
   a back-up module that is used as a back-up in the event of a failure of the first element in the first module leading to abnormal operation of the first module;
   a switching module, responsive to the determination unit determining that the first module is not operating normally, for performing a switching operation to switch operations of the first module to the back-up module.

2. The amplifier for an MRI device of claim 1, wherein the at least the first element and the at least the second element comprise a plurality of elements that are included in the first module and the second module, respectively, which are grouped respectively into the first module or the second module based on a history of failures of the first submodule and second submodule included in the amplifier.

3. A magnetic resonance imaging (MRI) device comprising:
   at least one amplifier including at least one an operating module for performing MRI on a subject;
   at least one control module for controlling the at least one operating module;
   at least one back-up control module that is used as a back-up in the event of a failure of the at least one control module leading to abnormal operation of the at least one control module;
   a determination unit configured to determine whether the at least one control module is operating normally and for designating the at least one control module and at the least one back-up control module based on a relative failure rate; and
   at least one switching module, responsive to the determination unit determining that the at least one control module is not operating normally, for performing a switching operation to switch control of the operating module to the at least one back-up control module.

4. The MRI of claim 3, wherein the at least one control module and the at least one back-up control module are each implemented in an integrated circuit board including elements for controlling the operating module.

5. The MRI of claim 3, wherein the at least one control module and the at least one back-up control module are each implemented to operate independently.

6. The MRI of claim 3, wherein, while the back-up control module is operating, the control module is replaced with another control module.

7. The MRI of claim 3, wherein, when the at least one control module is not operating normally, the operating module is controlled by the at least one back-up control module.

8. The MRI of claim 3, wherein, when the determination determines that the at least one control module is not operating normally, the at least one switching module automatically performs the switching operation.

9. The MRI of claim 3, wherein the at least one amplifier includes a gradient amplifier and a radio frequency (RF) amplifier;
   wherein the at least one control module includes a first control module for controlling the gradient amplifier and a second control module for controlling the RF amplifier;
   wherein the at least one back-up control module includes a first back-up control module for controlling the gradient amplifier and a second back-up control module for controlling the RF amplifier; and
   wherein the at least one switching module includes a first switching module for switching the first control module to the first back-up control module for controlling the gradient amplifier, and a second switching module for switching the second control module to the second back-up control module for controlling the RF amplifier.

10. The MRI of claim 9, wherein the at least one operating module includes a gradient amplifier operating module and an RF amplifier operating module, in which the gradient amplifier operating module for the gradient amplifier is controlled by using any control module selected from the group consisting of the first control module and the first back-up control module, and the RF amplifier operating module for the RF amplifier is controlled by using any control module selected from the group consisting of the second control module and the second back-up control module.

11. An amplifier for an MRI device, the amplifier comprising:
   an operating module for amplifying a waveform;
   a control module for controlling the operating module;
   at least one back-up control module that is used as a back-up in the event of a failure of the control module leading to abnormal operation of the control module in which the operating module and at least one back-up control module are designated based on a relative failure rate; and
   a switching module for performing a switching operation to switch control of the operating module to the at least one back-up control module.

12. The amplifier of claim 11, wherein each of the control module and the at least one back-up control module is implemented in an integrated circuit board including elements for controlling the operating module.

13. The amplifier of claim 11, wherein the amplifier is selected from the group consisting of a gradient amplifier and an RF amplifier.

14. A method of controlling at least one amplifier for an MRI device, the method comprising:
   designating at least one operating module and at least one back-up control module based on a relative failure rate;
   controlling at least one operating module of the at least one amplifier using at least one control module;
   providing at least one back-up control module that is used as a back-up in the event of a failure of the at least one control module leading to abnormal operation of the at least one control module;
   determining whether the at least one control module is operating normally;
   responsive to the determination that the at least one control module is not normally operating, performing a switching operation to switch control of the operating module to the at least one back-up control module; and
   responsive to the switching operation, controlling the operating module by using the at least one back-up control module.

15. The method of claim 14, wherein each of the at least one control module and the at least one back-up control module is implemented in an integrated circuit board including elements for controlling the operating module.

16. The method of claim 14, wherein the at least one amplifier includes a gradient amplifier;
   wherein the at least one operating module includes a gradient amplifier operating module;
   wherein the at least one back-up control module includes a first back-up control module for the gradient amplifier;
   wherein the at least one control module includes a first control module;
   wherein the determining of whether the at least one control module is operating normally includes determining whether the first control module for the gradient amplifier is operating normally;
   wherein the performing of the switching operation switches control of a first operating module for the gradient amplifier to the first back-up control module that is a back-up for the first control module; and
   wherein the controlling of the operating module includes using the first back-up control module to control the gradient amplifier operating module.

17. The method of claim 16, wherein the at least one amplifier includes a radio frequency (RF) amplifier;
   wherein the at least one operating module includes an RF amplifier operating module;
   wherein the at least one back-up control module includes a second back-up control module for the RF amplifier;
   wherein the determining of whether the control module is operating normally includes determining whether the second control module for the RF amplifier is operating normally;
   wherein the performing of the switching operation switches control of the second operating module for the RF amplifier to the second back-up control module that is a back-up for the second control module; and
   wherein the controlling of the operating module includes using the second back-up control module to control the RF amplifier operating module.

18. A method of controlling an amplifier for an MRI device, the method comprising:
   providing a first module having a first element for performing a first operation in the MRI device;
   providing a second module having a second element, wherein the first element of the first module has a relatively higher frequency of failure rate than the second element of the second module;
   providing a back-up module which is capable of performing the first operation;
   determining whether the first module is operating normally; and
   responsive to the determination that the first module is not operating normally, switching the first operation to be performed by the back-up module.

19. A non-transitory computer readable recording medium having embodied thereon a computer program for executing the method of claim 14.

20. A non-transitory computer readable recording medium having embodied thereon a computer program for executing the method of claim 18.

* * * * *